Figure 1:
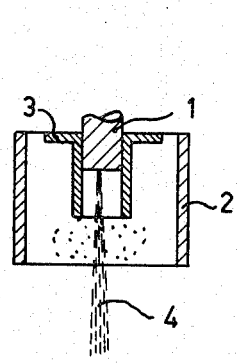

United States Patent [19]

Schoenmakers

[11] 4,004,172

[45] Jan. 18, 1977

[54] GAS DISCHARGE ELECTRON GUN FOR GENERATING AN ELECTRON BEAM BY MEANS OF A GLOW DISCHARGE

[75] Inventor: Theodorus Maria Berendina Schoenmakers, Eindhoven, Netherlands

[73] Assignee: U.S. Philips Corporation, New York, N.Y.

[22] Filed: May 8, 1975

[21] Appl. No.: 575,615

[30] Foreign Application Priority Data

May 27, 1974 Netherlands ............... 7407059

[52] U.S. Cl. .................... 313/217; 313/209; 313/210; 313/231.3

[51] Int. Cl.² ...................... H01J 17/04

[58] Field of Search ........... 313/209, 210, 217, 363, 313/231.3; 315/111.2, 111.3, 111.8

[56] References Cited

UNITED STATES PATENTS 3,614,510  10/1971  Maskell ............... 313/210 X

*Primary Examiner* — Palmer C. Demeo
*Assistant Examiner* — Darwin R. Hostetter
*Attorney, Agent, or Firm* — Frank R. Trifari; George B. Berka

[57] ABSTRACT

A gas discharge electron gun for generating an electron beam by secondary emission from an active surface of a cathode which is surrounded by a cathode sleeve coaxially projecting towards an open end of a tubular anode.

7 Claims, 5 Drawing Figures

GAS DISCHARGE ELECTRON GUN FOR GENERATING AN ELECTRON BEAM BY MEANS OF A GLOW DISCHARGE

The invention relates to a gas discharge electron gun for generating an electron beam by means of a glow discharge and consisting at least of an envelope, means to maintain a gaseous ionisable medium inside said envelope, which envelope comprises at least a cylindrical anode which is open at both sides, and a cathode, from which cathode electrons are released by secondary emission and in such a quantity that the said electron beam consists mainly of said electrons.

Such a gas discharge electron gun is known from the British patent specification No. 1,145,013 (R. A. Dugdale). Positive ions from the glow discharge collide on the cathode and liberate electrons there since they cause secondary emission. Said electrons are accelerated away from the cathode. In the cathode the electric field which the ions and electrons experience has a strong radial component. As a result of this the ion flow is directed more or less to a small part of the surface in the centre of the cathode and the secondary electrons leave the cathode in the form of a narrow beam. According to the British Patent Specification the device described therein has a high efficiency in that the aperture in the cylindrical anode has been chosen to be so large and the distance from the cylindrical anode to the cathode has been chosen to be so small that the glow discharge extends to in the anode. In said anode a large flow of ions is formed which impinge upon the cathode. As is also described in the British Patent Specification a cavity in the centre of the cathode may exert an influence on the shape of the electric field and hence on the shape of the electron beam. The shape and the power of the electron beam can be varied over a wide range by varying one or more discharge parameters. The gas discharge electron gun may operate at a rough vacuum (prevacuum) ($10^{-1}$–$10^{-2}$ Torr) and is therefore particularly suitable for material working such as drilling, welding, lacquer hardening, and so on, since gases and vapours originating from the workpiece disturb the vacuum only comparatively little. United States Pat. Nos. 3,218,431 and 3,509,410 describe gas discharge electron guns having so-called hollow cathodes which differ essentially from the cathodes described in the above-mentioned British Patent Specification. In a hollow cathode according to the United States Patent Specifications the electron beam is actually generated directly in the gaseous ionized medium (also termed plasma) which is present in the hollow cathode. The cathode described in the British Patent Specification, however, supplies mainly electrons by secondary emission at least from a part of the cathode surface. The gas discharge electron gun according to the British Patent Specification, sometimes termed hollow anode gun, has proved to be particularly suitable in practice for high-accuracy processes.

It is one object of the invention to provide a gas discharge electron gun for generating an electron beam which permits the application of a high accelerating voltage between the cylindrical anode and the cathode without the occurance of noise and breakdowns (arc discharges).

Another object of the invention is to make the construction of the gas discharge electron gun more compact so as to enable in this manner a more favourable heat dissipation and a gas discharge electron gun is obtained having an even more favourable efficiency (cathode-current − anode current)/cathode current) × 100%.

A third object of the invention is to provide a construction which reduces pollution of the insulation material between the cylindrical anode and the cathode considerably and also provides a shielding against X-ray radiation.

According to the present invention, a gas discharge electron gun of the kind mentioned in the first paragraph is characterized in that the active cathode surface is at least a part of the bottom of a cathode sleeve arranged coaxially around the axis of the cylindrical anode and the second side of which, which is present opposite to the said bottom, is open.

The cathode sleeve has the same potential as the cathode and influences the shape of the field lines near the cathode just as the cavity in the centre of the cathode in the British Patent Specification. In the absence of the cathode sleeve according to the invention, a part of the discharge does not contribute to the formation of the electron beam but does contribute to the heat evolution in the cathode and gives rise to noise and breakdowns and hence reduction of the efficiency. It is also prevented by the cathode sleeve that the insulation between the cylindrical anode and the cathode deteriorates in that it is covered with a layer consisting of sputtered material of the cathode and impurities from the gaseous ionisable medium in the said envelope. The X-ray radiation outside the gun is reduced by the cathode sleeve by a factor 20, while if the cathode and cathode sleeve are placed in the anode, X-ray radiation outside the gas discharge electron gun is substantially out of the question. Observations have demonstrated that with a depth of the cathode sleeve according to the invention (distance between the cathode surface and the opposite second side) of 4–8 mm, the gas discharge electron gun operates readily and that an optimum operation is achieved with a depth of approximately 6 mm. This is substantially independent of the inside diameter of the cathode sleeve. The inside diameter should be adapted to the current maximally derived from the gas discharge electron gun, for example $\phi$ 8 mm at currents up to 40 mA. It is recommendable to make the distance of the anode and cathode sleeve nowhere smaller than 5 mm so as to prevent breakdowns.

The sputtered materials originating from the cathode will partly deposit on the inner wall of the cathode sleeve. It is therefore recommendable to manufacture the said cathode sleeve from two coaxial cylinders fitting one in the other and the innermost of which can easily be replaced. It has been found that when the inner cylinder is manufactured from a fine-mesh electrically conductive gauze, the pollution does not give rise to noise and breakdowns, not even after two to three hours in operation. A gauze inner cylinder of CuSn gives particularly good satisfaction. The outside of the gauze inner cylinder bears against the inner wall of the outer cylinder of the cathode sleeve and is hence not exposed directly to a deposit of contaminations from the discharge. As a result of this, space charge which may cause disturbance can leak away via the side of the said gauze facing the inner wall of the outer cylinder of the cathode sleeve. A ratio with the gauze of the surface area of the material to the surface area of the hole of 1:3 gives best satisfaction.

An aluminium cathode combined with a copper cathode sleeve with possibly an inner cylinder of CuSn yields an electron gun having a very high efficiency. An explanation for this is inter alia the high secondary electron emission coefficient for aluminium.

Figure 2:
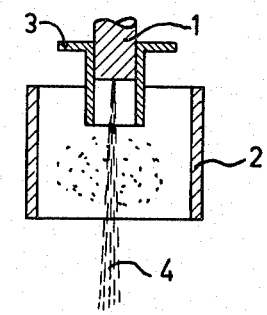
Figure 3:
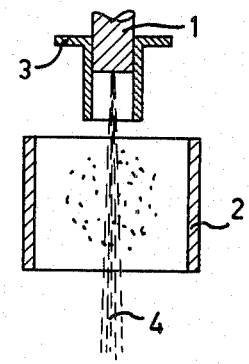
Figure 4:
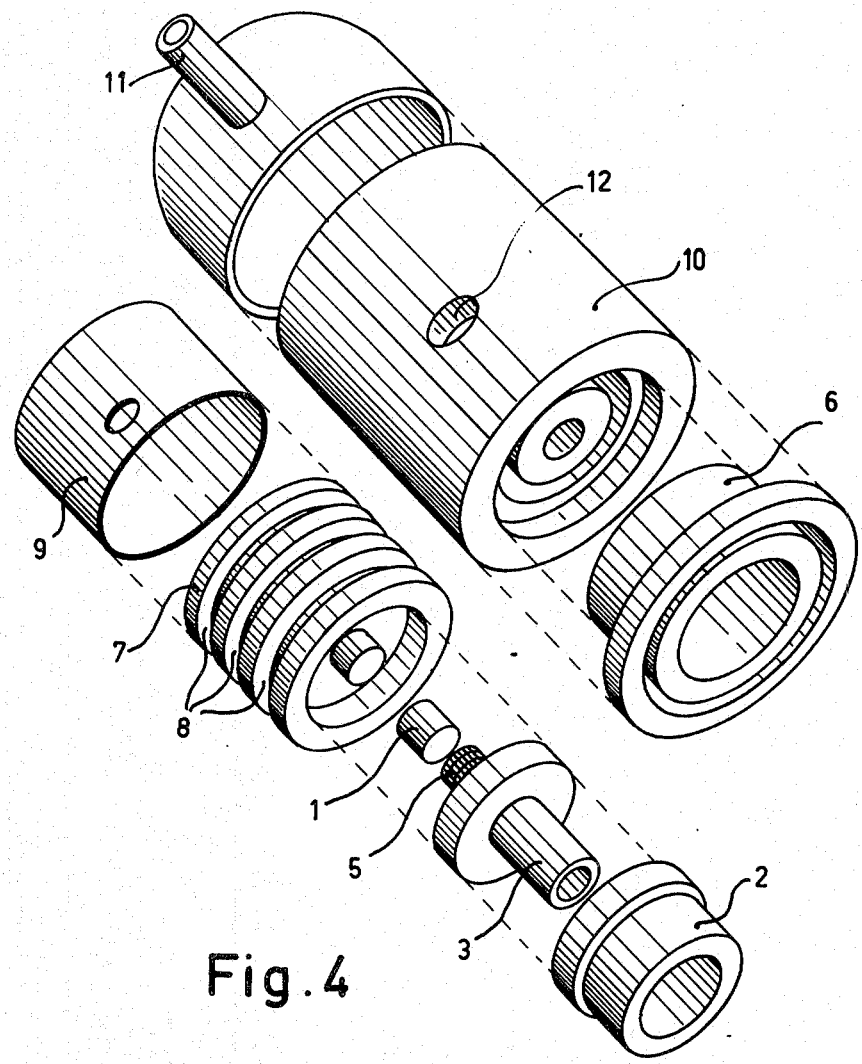
Figure 5:
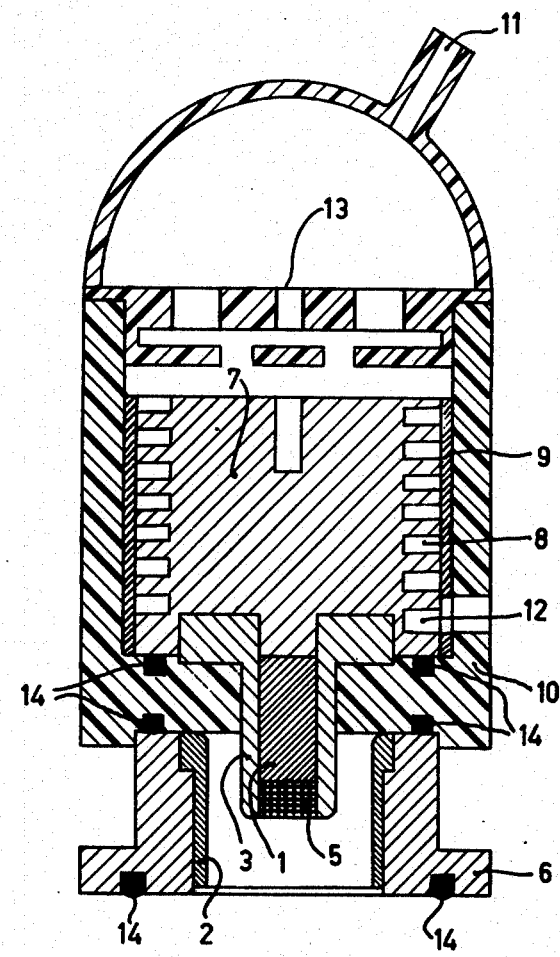

The invention will now be described in greater detail with reference to the accompanying drawing, of which the figures FIGS. 1 to 3 inclusive show a number of possible positions of the cathode and cathode sleeve opposite to the cylindrical anode, FIG. 4 is an exploded view of an embodiment, FIG. 5 is a sectional view of an embodiment.

Referring now to FIG. 1, both the cathode 1 and the cathode sleeve 3 are placed in the cylindrical anode 2. In FIG. 2, the cathode sleeve 3 terminates in the cylindrical anode 2, while the cathode 1 is present outside the cylindrical anode 2. In FIG. 3 the cathode 1 and the cathode sleeve 3 are present outside the cylindrical anode. Although the latter construction has a lower efficiency than that shown in FIG. 2 and a considerably lower efficiency than that shown in FIG. 1, the electron beam diameter in this case can be made smaller since the electrode geometry is optically more favourable. In all three constructions the cathode surface may be concave, convex or be arranged not at right angles to the axis of the gas discharge electron gun. In any case the electron beam 4 will immerge from the centre of the said cathode. The depth of the cathode sleeve is always to be understood to mean the distance from its open end to the centre of the cathode. The cathode and cathode sleeve may be manufactured from one kind of material and be formed integral. In that case it is recommendable to use copper. In the case of aluminium, a coating with $Al_2O_3$ occurs actually on the inside of the cathode sleeve, which causes instabilities.

FIG. 4 is an exploded view of an embodiment of the gas discharge electron gun according to the invention. The cathode 1 fits in the cathode sleeve 3 together with the gauze-like inner cylinder 5. Said cathode sleeve is placed coaxially in the cylindrical anode 2 which bears in the anode ring 6. The cathode 1 and the cathode sleeve 3 are cooled by the cooling member 7 through which air flows via the duct 8. The cooling member is closed by sleeve 9 and is placed in the synthetic (insulation) housing 10. The cooling air is introduced into the cooling member 7 via the inlet 11, passes through duct 8 and leaves the cooling member through the aperture 12.

FIG. 5 is a sectional view of the assembled gas discharge electron gun shown in FIG. 4. The cathode 1 is brought at a negative potential relative to the cylindrical anode 2 via the contact 13 (for example 10–100 kV). The construction has been made gas-tight by means of O-ring seals 14. The cathode 1 may also be arranged detachably relative to the cathode sleeve 3 so that there is a gap between the cathode and the cathode sleeve. In that case the cathode sleeve should be connected electrically to the cathode, whether or not via the cooling member. The cathode may also be constructed so that a new part thereof is always exposed to the ion bombardment. This may be done by causing the cathode to rotate.

The voltage between the anode and the cathode may also be reversed and adapted so that an ion beam is formed instead of an electron beam.

What is claimed is:

1. A gas discharge electron gun for generating an electron beam by means of a glow discharge, comprising, within an envelope, means to produce a gaseous ionizable medium, a tubular anode defining two open ends, a cathode arranged coaxially with said anode and having an active surface from which electrons are released by secondary emission in such a quantity as to form a beam composed mainly of the secondary electrons, and a conductive sleeve connected to said cathode around said active surface and projecting toward an open end of said anode.

2. A gas discharge electron gun as claims in claim 1, wherein the depth of the projecting portion of said sleeve is between 4 and 8 mm.

3. A gas discharge electron gun as claimed in claim 1, wherein said cathode sleeve consists of two coaxial cylinders fitting one in the other and the inner cylinder of which is removable.

4. A gas discharge electron gun as claimed in claim 3, wherein said inner cylinder consists of a fine-mesh, electrically conductive gauze.

5. A gas discharge electron gun as claimed in claim 4, wherein the ratio between the surface area of the material and the open surface area of the fine-mesh gauze is approximately 1:3.

6. A gas discharge electron gun as claimed in claim 5, wherein said fine-mesh gauze is manufactured from CuSn.

7. A gas discharge electron gun as claimed in claim 1, wherein the cathode consists of aluminium and the cathode sleeve consists of copper.

* * * * *